United States Patent [19]

Avnery et al.

[11] Patent Number: 5,126,633
[45] Date of Patent: Jun. 30, 1992

[54] METHOD OF AND APPARATUS FOR GENERATING UNIFORM ELONGATED ELECTRON BEAM WITH THE AID OF MULTIPLE FILAMENTS

[75] Inventors: Tzvi Avnery, Winchester; Arthur W. Sommerstein, Lynn; Rolfe W. Graham, Woburn, all of Mass.

[73] Assignee: Energy Sciences Inc., Wilmington, Mass.

[21] Appl. No.: 737,240

[22] Filed: Jul. 29, 1991

[51] Int. Cl.[5] .................. H01J 29/46; H01J 29/56
[52] U.S. Cl. .................... 315/14; 313/299; 328/227
[58] Field of Search .................. 315/14, 15, 366; 313/372, 373, 343, 298, 299, 300, 422; 328/227, 233

[56] References Cited

U.S. PATENT DOCUMENTS

| | | | |
|---|---|---|---|
| 3,702,412 | 11/1972 | Quintal | 313/299 |
| 3,863,163 | 1/1975 | Farrell et al. | 313/299 |
| 4,100,450 | 7/1978 | Frutiger et al. | 313/360 |

Primary Examiner—Theodore M. Blum
Attorney, Agent, or Firm—Rines and Rines Shapiro and Shapiro

[57] ABSTRACT

A novel electron beam apparatus and technique wherein a plurality of longitudinally extending heated filaments is employed, each similarly offset laterally of a central longitudinal axis, but with successive filaments alternately disposed on opposite sides of said axis and cooperating with a first low velocity accelerating stage comprising staggered grid slots and openings, and a high velocity second accelerating stage to provide long uniform longitudinal electron beams.

15 Claims, 3 Drawing Sheets

METHOD OF AND APPARATUS FOR GENERATING UNIFORM ELONGATED ELECTRON BEAM WITH THE AID OF MULTIPLE FILAMENTS

The present invention relates to electron beam generators and guns, being more particularly directed to the generating of long linear electron beams as for irradiating electron-beam curable coatings, films, and surfaces-to-be-sterilized or otherwise treated, and the like.

BACKGROUND

Prior techniques for generating long electron beams, as for wide or long webs, surfaces or work pieces demanding uniform and simultaneous electron beam irradiation, have included the longitudinal single filament type gun constructions disclosed, for example, in U.S. Pat. Nos. 3,702,412 and 4,100,450 of common assignee herewith. The core technology of the above patents involves a single filament which is positioned over the entire length of the electron gun, and which supplies all of the electrons over the full length of the machine. Multiple single filament guns, mounted side by side (in parallel) over the full length of the machine can also be used for increased beam power. The filament is generally surrounded by plates at positive voltage ("Extractor Voltage", Vex) to attract electrons, with one plate, the control grid, having an opening slit for some of the electrons to be accelerated in the desired direction. The open slit is positioned parallel to the filament and extends the full length of the gun.

Experience and theory show that such a long single filament gun has good linear beam uniformity characteristics for an electron beam current dynamic range of about 20:1. A 500 mA electron gun accelerator using a single filament gun, for example, has good linear beam uniformity over a range of 25 mA to 500 mA. At a dynamic range greater than 20:1, however, the linear beam uniformity at low current begins to deteriorate and becomes worse as the dynamic range increases. For example, for the same 500 mA gun accelerator, the beam uniformity at 10 mA is better than the uniformity at 5 mA, and so on. This phenomenon is due to the effect of the filament voltage drop on extraction voltage. The longer the filament length, the greater the voltage drop. The filament is heated by an AC power supply which produces an alternating (AC) voltage across the filament $V_{fil}$, such voltage being added to or subtracted from the DC grid extractor voltage V, depending on the time in the AC cycle, as later explained; and for long filaments, results in current variations along the filament that produce non-uniform electron extraction.

OBJECTS OF INVENTION

It is accordingly an object of the present invention to provide a new and improved method of and apparatus for generating uniform elongated electron beams that shall not be subject to the above limitations and that achieve very long coherent high density electron beams with the aid of multiple electron gun filaments.

A further object is to provide a novel elongated electron gun of improved linear beam uniformity.

Other and further objects will be explained hereafter and are more fully delineated in the appended claims.

SUMMARY

In summary, however, the invention embraces a method of providing a substantially uniform elongated longitudinally extending linear beam of electrons for exiting through a longitudinally extending electron beam window, symmetrically along and aside its longitudinal central axis, that comprises, generating successive similar longitudinally extending substantially coplanar linear electron segments each similarly offset laterally of said longitudinal axis but with successive segments alternately disposed on opposite sides of said longitudinal axis and with adjacent segment ends somewhat overlapping in the longitudinal direction; initially accelerating the generated successive electron segments at relatively low speed to provide a relatively negligible effect upon the final direction of the electrons through the beam window; and further accelerating the electron segments at a relatively high speed to exit the longitudinal beam with substantially uniform beam characteristics and direction along and to the sides of said longitudinal axis. Preferred and best mode electron gun designs are later presented.

THE DRAWINGS

The invention will now be explained in connection with the accompanying drawings, FIG. 1 of which is a graph plotting extraction voltage Vex as a function of time, for a single AC voltage cycle;

DESCRIPTION OF INVENTION

Figure 1:
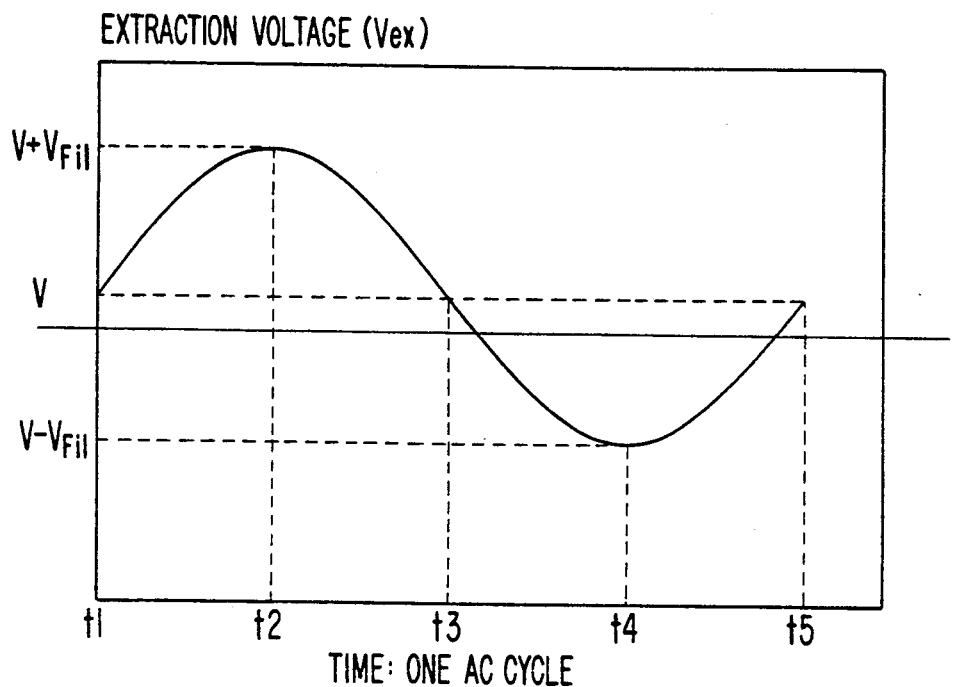
Figure 2:
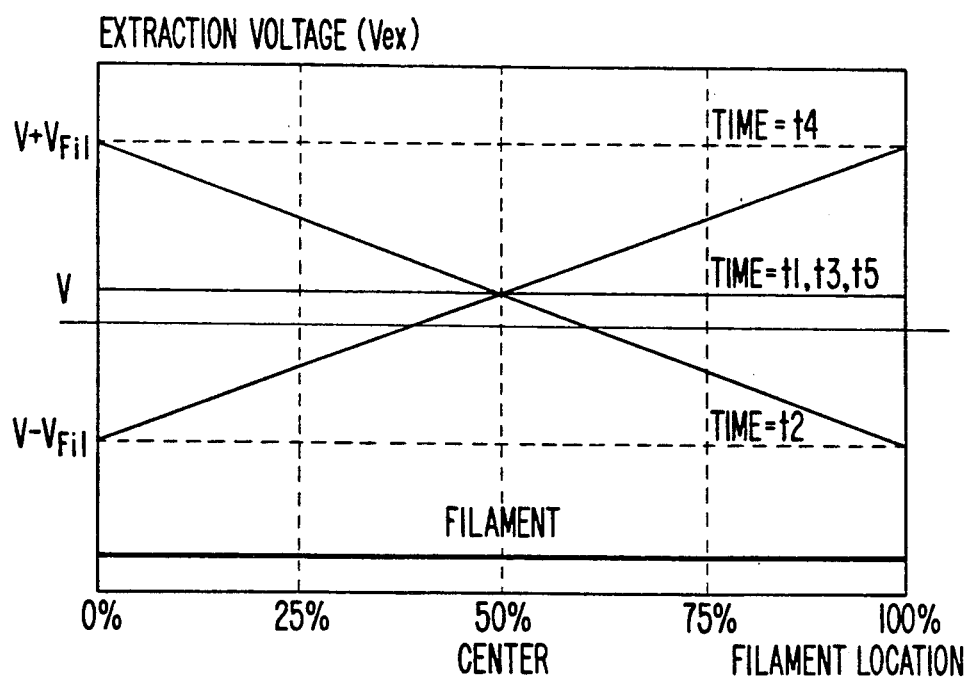
FIG. 2 is a graph plotting the filament voltage effect on extraction voltage as a function of location along the filament.

As before explained, the electron gun filament voltage at any point along the filament during each AC cycle is the sum or difference at successive instants of time during the cycle of the AC voltage and the DC grid voltage as shown in FIG. 1. The magnitude of the DC extraction voltage is normally held constant for a fixed beam current and would only be varied as the amount of beam current required changes. The filament voltage effect on extraction voltage Vex as a function of the location over the filament length is shown in FIG. 2 for a single long filament. The electron beam current I extracted from the hot filament behaves as follows:

$$I = K \int_{t1}^{t5} (Vex)^{3/2} dt,$$

where:
I = electron beam current
k = gun constant
Vex = extraction voltage
t1 = beginning of one AC cycle
t5 = end of one AC cycle.

The extractor voltage Vex on the filament can be represented as follows:

$$V_{ex} = V + V_{fil} \sin wt. \quad (2)$$

where w=frequency of the AC power, t=time, and $V_{fil}$ the filament voltage along the filament.

The electron beam is then represented by the integration of the above expression over one AC cycle time as follows:

$$I = K \int_{t1}^{t5} (V + V_{fil} \sin wt)^{3/2} \, dt$$

Expression (3) shows higher values from the center of the filament out to the ends, with FIG. 2 illustrating how $V_{fil}$ increases from the center out. The most critical parameter is the ratio $V_{fil}/V$. As the electron beam current increases, the ratio $V_{fil}/V$ decreases and, therefore, the uniformity improves dramatically.

Figure 3:
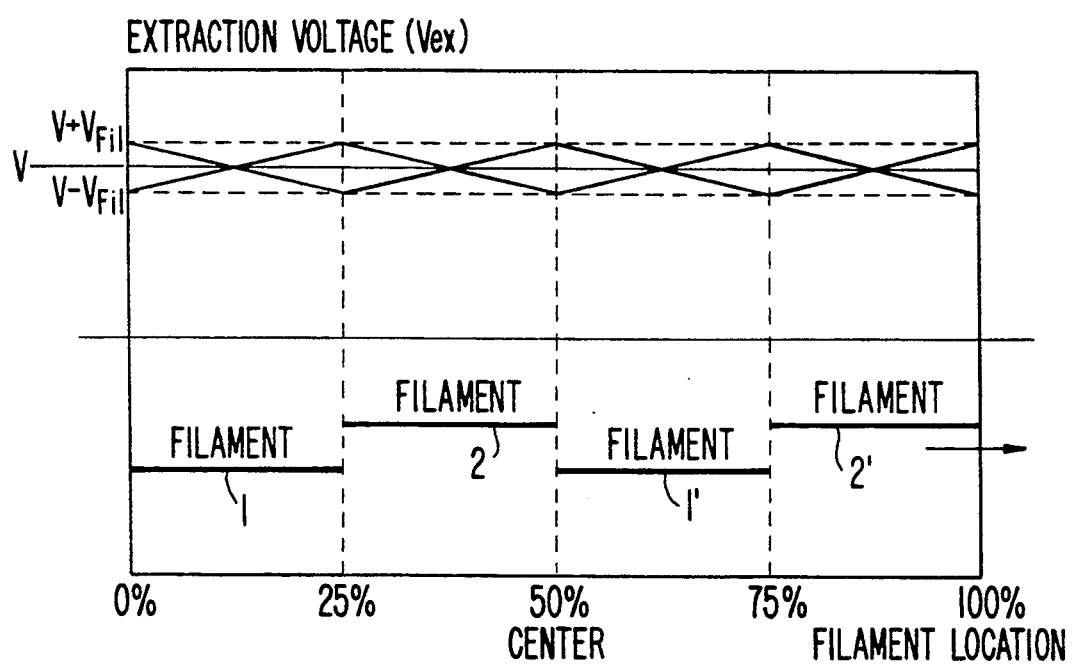
FIG. 3 is a similar graph of the improvement obtainable with the novel multi-filament distribution of the present invention.
Figure 4:
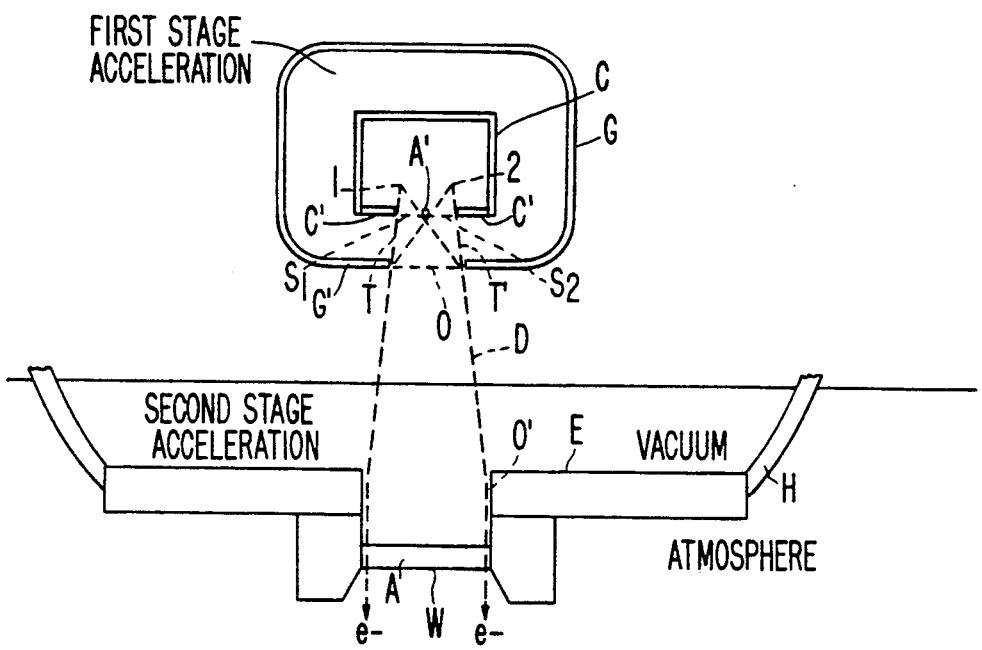
FIG. 4 is a transverse section of an electron gun constructed in accordance with a preferred embodiment of the invention.
Figure 5:
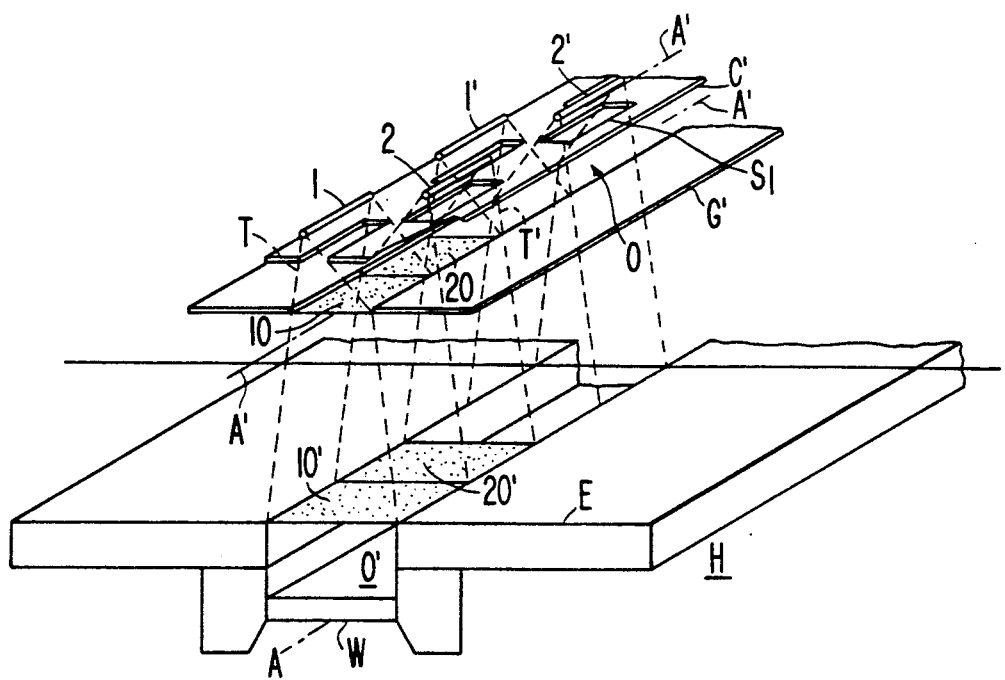
FIG. 5 is an isometric, though fragmentary view of the apparatus of FIG. 4.

Underlying the present invention is the use of multiple or a plurality of similar successive longitudinally extending substantially coplanar heated filament sections or segments 1, 2, 1'. 2', etc. Each filament is shown in FIGS. 3, 4 and 5 as laterally offset the same or similar distance to a side of a longitudinal central axis A', but with the successive filaments (1 and 2) alternately staggered and disposed on opposite sides of said axis. The axis A' runs centrally along longitudinal opening O in a bottom wall or plate G' of a longitudinally extending high voltage grid terminal tube G, providing DC bias potential to accelerate electrons from the filaments to the longitudinal opening O of the wall G', in a first or upper acceleration stage. While the grid opening O (and the later described gun slots) is shown for clarity purposes as a simple opening, in practice it may be a grid or screen or multiple aperture structure, and the term "opening" as used herein is intended to embrace such.

Below the grid opening O and in vertical alinement therewith is disposed a longitudinally extending parallel electron beam window W, as of aluminum or the like, as is well known, the longitudinal central axis A of which is parallel to and in vertical alignment with the grid opening axis A'. The window W closes off a vacuum in a housing H containing the filaments and grid and enables exiting of the generated linear electron beam.

The successively oppositely laterally offset filaments 1, 2, 1', 2', etc. are mounted within a tubular gun body C, as more particularly shown in FIG. 4, which in turn extends longitudinally and parallely within and along the tubular, high voltage terminal G. The bottom wall or plate C' of the gun body C is provided with a plurality of slots $S_1$, $S_2$, $S_1'$, $S_2'$, etc., one corresponding to each successive filament 1, 2, 1', 2', etc., and disposed therebelow in the same alternate-side lateral offset configuration, equally and oppositely spaced from the center line axis A', to permit the passage of electrons from the respective filaments exiting through the corresponding slots, and initially accelerated in this upper stage to pass to the corresponding successive longitudinal regions 10, 20, etc. of the opening O, FIG. 5.

The electron beam optics of this construction causes the filament-generated successive separate electron segments to be accelerated to the common grid opening O at relatively low speed as compared with the later-described second acceleration stage. The first-to-second stage accelerating potential have a typical voltage ratio of 1 to 1000. The equipotential field lines create a converging lens effect so that the divergent velocity vector of the electrons entering O has a relatively negligible effect upon the final direction of the electrons which come to focus at the exit window W. Because of the alternately offset positions of the filaments and corresponding slots (1-$S_1$, and 2-$S_2$, for example), the respective electron distributions and directions from each at the corresponding successive longitudinal sections 10, 20, etc. of the grid opening O, are unsymmetrical, being of transverse profile of complementary triangles T, $T^1$, FIGS. 4 and 5, sharing a common base, and with their inner sides intersecting near the axis A'.

Such lack of distribution and direction symmetry would, of course, result in a non-uniform overall longitudinal beam; but such is corrected by the subsequent or second lower acceleration stage comprising a planar accelerating electrode E, centrally mounting the window W in a longitudinally extending opening O' parallel to, below and vertically alined with, and shown wider than, the high voltage terminal grid opening O of the first acceleration stage. The electrode E also serves as the lower part of the housing H, and is adjusted relative to the first acceleration stage to accelerate the electrons at O downwardly at a relatively very high speed, shaping and controlling the distribution and direction of the electron segments 10, 20, etc. to exit the window W with uniform distribution at 10', 20' etc. FIG. 5, over the total longitudinal beam. This is effected by the electron focusing optics of a symmetrically diverging transverse profile D, then exiting the beam sections substantially orthogonally to the window ($e^-$ in FIG. 4).

In actual practice, the electrical connections (not shown) at the filament ends to the AC power tend to cool the ends which then have higher work functions for the emission of electrons, creating a drop in the electron beam intensity at those positions. To obviate this effect, the successive filaments 1, 2, 1', 2', etc. are somewhat overlapped longitudinally, and their respective grid slots $S_1$, $S_2$, $S_1'$, $S_2'$ are each made somewhat shorter than the filaments as shown in FIG. 5, such that the cold filament ends are positioned outside the slot openings to suppress the electrons generated at such filament ends. This ensures that only uniform emission areas of the filaments are used.

Further modifications will occur to those skilled in this art and such are considered to fall within the spirit and scope of the invention as defined in the appended claims.

What is claimed is:

1. A multiple filament longitudinally extending elongated electron beam gun apparatus for exiting a substantially uniform linear beam of electrons through a longitudinally extending electron beam window, symmetrically along and aside its longitudinal central axis, having, in combination, a plurality of voltage-fed similar successive longitudinally extending substantially coplanar filaments each similarly offset laterally of said longitudinal axis but with successive filaments alternately disposed on opposite sides of said longitudinal axis and with their adjacent ends somewhat overlapping in the longitudinal direction; a first acceleration stage grid means having a longitudinal opening alined with and parallel to the said electron beam window and serving as a high voltage terminal to accelerate electrons from the filaments at relatively low speed so as to provide a relatively negligible effect upon the final direction of the electrons through the beam window; and a second stage accelerating electrode means having a longitudinal opening alined with and parallel to that of the grid means and disposed near the beam window for accelerating the electrons leaving the grid means opening at a relatively high speed to exit the beam window with substantially uniform beam characteristics and direction, along and to the side of the said longitudinal axis.

2. A multiple filament electron beam gun as claimed in claim 1 and in which the grid means is further provided between the filaments and the said longitudinal opening with a gun grid plate having a plurality of slots corresponding to the successive filaments and disposed in respective alinement therewith on alternately opposite sides of said longitudinal axis.

3. A multiple filament electron beam gun as claimed in claim 2 and in which each grid slot is slightly shorter than the length of its corresponding filament so that the ends of the filament are just outside the ends of the slots.

4. A multiple filament electron beam gun as claimed in claim 3 and in which the electrons generated near the said ends of each filament at which voltage is supplied by electrical connections that exert a cooling effect thereat, are suppressed by lying outside the shorter grid slot.

5. A multiple filament electron beam gun as claimed in claim 2 and in which the grid means is formed in a longitudinally extending gun body tube having said slots disposed along an electron exiting wall of the tube, and internally mounting the filaments there-adjacent.

6. A multiple filament electron beam gun as claimed in claim 5 and which the grid means longitudinal opening is provided in a longitudinal high voltage terminal tube surrounding and coextensive with the gun body tube, and with its longitudinal opening disposed in a wall corresponding to the said electron-exiting wall of the gun body tube, and serving as the high voltage terminal grid opening.

7. A multiple filament electron beam gun as claimed in claim 6 and in which the electron beam window closes the second stage accelerating electrode longitudinal opening.

8. A multiple filament electron beam gun as claimed in claim 7 and in which all of the filaments, gun body tube, high voltage terminal tube and accelerating electrode structures are contained within a common vacuum closed off by said electron beam window.

9. A multiple filament electron beam gun as claimed in claim 2 and in which the electron beam optics provided by said first acceleration stage produces unsymmetrical successive longitudinal beam segment distributions and direction at the successive sections of the high voltage terminal longitudinal opening, corresponding to the successive offset filaments and their respective slots; and the second stage accelerating electrode means renders the successive longitudinal sections of the beam finally exiting the window substantially uniform in current density and direction.

10. A multiple filament electron beam gun as claimed in claim 9 and in which the transverse beam profiles of adjacent filaments are complementary triangles having a common base along the high voltage terminal longitudinal opening and inner sides intersecting near the longitudinal center line between the offset slots.

11. A multiple filament electron beam gun as claimed in claim 10 and in which the transverse beam profile beyond the high voltage terminal longitudinal opening, uniformly and symmetrically diverges from said opening to the region of the second accelerating stage electrode means opening, whence it proceeds substantially orthogonally to and through the electron beam window.

12. A multiple filament electron beam gun as claimed in claim 2 and in which the successive filaments are powered by one of series, parallel and combined series-parallel voltage feed.

13. A method of providing a substantially uniform elongated longitudinally extending linear beam of electrons for exiting through a longitudinally extending electron beam window, symmetrically along and aside its longitudinal central axis, that comprises, generating successive similar longitudinally extending substantially co-planar linear electron segments, each similarly offset laterally of said longitudinal axis but with successive segments alternately disposed on opposite sides of said longitudinal axis and with adjacent segment ends somewhat overlapping in longitudinal direction; initially accelerating the generated successive electron segments at relatively low speed to provide a relatively negligible effect upon the final direction of the electrons through the beam window; and further accelerating the electron segments at a relatively high speed to exit the beam with substantially uniform beam characteristics and direction along and to the sides of said longitudinal axis.

14. A method as claimed in claim 13 and in which the electrons generated at the ends of the successive segments are suppressed.

15. A method as claimed in claim 13 and in which the initial accelerating is effected with a transverse profile of adjacent beam segments comprising complementary triangles having a common base and inner sides intersecting along a longitudinal axis parallel to said longitudinal central axis; and in which the further accelerating is effected with a transverse profile of adjacent beam segments symmetrically diverging and then substantially orthogonally exiting the electron beam window.

* * * * *